US012754788B2

(12) United States Patent
Guo et al.

(10) Patent No.: US 12,754,788 B2
(45) Date of Patent: Oct. 6, 2026

(54) NON-VOLATILE MEMORY SWITCH WITH HOST ISOLATION

(71) Applicant: Marvell Asia Pte Ltd, Singapore (SG)

(72) Inventors: Liping Guo, Palo Alto, CA (US); Yingdong Li, Palo Alto, CA (US); Scott Furey, Cupertino, CA (US); Salil Suri, Fremont, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/892,709

(22) Filed: Sep. 23, 2024

(65) Prior Publication Data

US 2025/0013516 A1 Jan. 9, 2025

Related U.S. Application Data

(63) Continuation of application No. 18/101,495, filed on Jan. 25, 2023, now Pat. No. 12,099,398, which is a
(Continued)

(51) Int. Cl.
*G06F 11/00* (2006.01)
*G06F 11/07* (2006.01)
(Continued)

(52) U.S. Cl.
CPC .......... *G06F 11/073* (2013.01); *G06F 11/108* (2013.01); *G11C 29/023* (2013.01); *G11C 29/52* (2013.01)

(58) Field of Classification Search
CPC ................. G06F 11/073; G06F 11/108; G06F 2213/0026; G06F 11/0173; G06F 11/1048;
(Continued)

(56) References Cited

U.S. PATENT DOCUMENTS 6,804,766 B1 10/2004 Noel et al.
7,657,663 B2 2/2010 Freimuth et al.
(Continued)

FOREIGN PATENT DOCUMENTS

CN 103098428 A 5/2013
CN 103270736 A 8/2013
(Continued)

OTHER PUBLICATIONS

Notice of Allowance for U.S. Appl. No. 18/092,403, mailed May 14, 2024. (5 pages).
(Continued)

*Primary Examiner* — Sarai E Butler

(57) ABSTRACT

In a system with multiple host computers and one or more single-port non-volatile memory devices, a non-volatile memory switch receives memory transaction messages from different root complexes corresponding to the multiple host computers. Each of at least some of the memory transaction messages includes a host identifier that identifies a root complex from which the memory transaction was received. The non-volatile memory switch generates modified memory transaction messages at least by changing host identifiers within memory transaction messages to a common value indicative of a single root complex to present to the one or more single-port non-volatile memory devices the different root complexes as the single root complex. The non-volatile memory switch maintains associations of memory transaction messages with corresponding ones of the different root complexes, and sends the modified memory transaction messages to the one or more single-port non-volatile memory devices.

22 Claims, 8 Drawing Sheets

Related U.S. Application Data continuation of application No. 16/532,272, filed on Aug. 5, 2019, now Pat. No. 11,614,986.

(60) Provisional application No. 62/715,713, filed on Aug. 7, 2018.

(51) Int. Cl.
*G06F 11/10* (2006.01)
*G11C 29/02* (2006.01)
*G11C 29/52* (2006.01)

(58) Field of Classification Search
CPC ... G06F 11/0766; G06F 11/10; G06F 11/1068
USPC ........................................................ 714/1–57
See application file for complete search history.

(56) References Cited

U.S. PATENT DOCUMENTS

| | | | | |
|---|---|---|---|---|
| 8,185,664 | B1 | 5/2012 | Lok et al. | |
| 8,897,303 | B2 | 11/2014 | Xiong | |
| 8,966,164 | B1 | 2/2015 | Asnaashari et al. | |
| 9,019,792 | B2 * | 4/2015 | Sweere | G11C 5/14 365/228 |
| 9,098,402 | B2 | 8/2015 | Fanning et al. | |
| 9,298,648 | B2 | 3/2016 | Johnson et al. | |
| 9,430,412 | B2 | 8/2016 | Huang | |
| 9,652,426 | B2 | 5/2017 | Su | |
| 9,842,075 | B1 | 12/2017 | Davis et al. | |
| 9,934,173 | B1 | 4/2018 | Sakalley et al. | |
| 10,579,305 | B2 | 3/2020 | Lu | |
| 10,977,199 | B2 | 4/2021 | Suri et al. | |
| 11,086,813 | B1 | 8/2021 | Schuette | |
| 11,544,000 | B2 | 1/2023 | Furey | |
| 11,614,986 | B2 | 3/2023 | Guo et al. | |
| 12,099,398 | B2 | 9/2024 | Guo et al. | |
| 2003/0126195 | A1 * | 7/2003 | Reynolds | G06F 11/2038 714/E11.008 |
| 2003/0212785 | A1 | 11/2003 | Jibbe | |
| 2008/0104283 | A1 | 5/2008 | Shin et al. | |
| 2008/0126547 | A1 | 5/2008 | Waldspurger | |
| 2012/0014386 | A1 | 1/2012 | Xiong et al. | |
| 2012/0110233 | A1 | 5/2012 | Higuchi et al. | |
| 2013/0007332 | A1 | 1/2013 | Teh et al. | |
| 2014/0082258 | A1 * | 3/2014 | Ober | G06F 3/0688 711/170 |
| 2014/0122768 | A1 * | 5/2014 | Su | G06F 13/4282 710/314 |
| 2014/0189427 | A1 | 7/2014 | Jayaprakash Bharadwaj | |
| 2014/0298086 | A1 * | 10/2014 | Haneda | G11C 7/10 711/154 |
| 2015/0074320 | A1 | 3/2015 | Galles | |
| 2015/0082080 | A1 | 3/2015 | Lin et al. | |
| 2015/0153962 | A1 * | 6/2015 | Salessi | G06F 1/3275 711/103 |
| 2015/0169331 | A1 * | 6/2015 | Nelogal | G06F 9/441 710/108 |
| 2015/0248366 | A1 | 9/2015 | Bergsten et al. | |
| 2015/0261709 | A1 | 9/2015 | Billi | |
| 2015/0293873 | A1 | 10/2015 | Shao et al. | |
| 2015/0317088 | A1 | 11/2015 | Hussain et al. | |
| 2016/0127492 | A1 | 5/2016 | Malwankar et al. | |
| 2016/0132395 | A1 | 5/2016 | Bolen | |
| 2016/0147592 | A1 * | 5/2016 | Guddeti | H04L 1/0082 714/776 |
| 2017/0024166 | A1 | 1/2017 | Singh et al. | |
| 2017/0090794 | A1 | 3/2017 | Huang | |
| 2017/0212579 | A1 | 7/2017 | Tirumala et al. | |
| 2017/0286363 | A1 | 10/2017 | Joshua et al. | |
| 2018/0074757 | A1 | 3/2018 | Yamaguchi et al. | |
| 2018/0253138 | A1 | 9/2018 | Bakshi et al. | |
| 2018/0357108 | A1 | 12/2018 | Mullender et al. | |
| 2019/0310913 | A1 | 10/2019 | Helmick et al. | |
| 2019/0361763 | A1 * | 11/2019 | Bakshi | H01G 9/06 |
| 2019/0361773 | A1 | 11/2019 | Berke et al. | |
| 2020/0050402 | A1 | 2/2020 | Furey et al. | |
| 2020/0050505 | A1 | 2/2020 | Guo et al. | |
| 2020/0050558 | A1 | 2/2020 | Suri et al. | |

FOREIGN PATENT DOCUMENTS

| | | | |
|---|---|---|---|
| WO | 2014099025 | A1 | 6/2014 |
| WO | 2015080690 | A1 | 6/2015 |

OTHER PUBLICATIONS

Office Action for Korean Application No. 10-2019-0096065, mailed Nov. 21, 2024. (6 pages).
Second Office Action for Chinese Application No. 201910727578.X mailed Dec. 2, 2024. (6 pages).
Summons to Attend Oral Proceedings in European App. No. 19 190 675.9, mailed Oct. 5, 2022 (7 pages).
Communication pursuant to Article 94(3) EPC in European Patent Application No. 19190605.6, dated Jan. 19, 2021 (5 pages).
Communication pursuant to Article 94(3} EPC in European Patent Application No. 19190675.9, dated Feb. 3, 2021 (5 pages).
EP Application No. 19190605.6, Extended Search Report, mailed Dec. 9, 2019, 8 pages.
EP Application No. 19190675.9, Extended Search Report, mailed Dec. 9, 2019, 7 pages.
EP Application No. 19190677.5, Extended Search Report, mailed Dec. 9, 2019, 7 pages.
Extended Search Report for European Patent Application No. 23207046.6, mailed Mar. 5, 2024. (8 pages).
Extended Search Report for European Patent Application No. 23216230.5, mailed Mar. 4, 2024. (8 pages).
First Office Action for Chinese Application No. 201910727578.X, mailed Jun. 28, 2024. (14 pages).
First Office Action for Chinese Application No. 2019107309432, mailed Mar. 31, 2024. (6 pages).
First Office Action for Chinese Application No. 2019107311146, mailed Oct. 26, 2023. (9 pages).
Non-Final Office Action in U.S. Appl. No. 18/101,495, mailed Oct. 12, 2023 (6 pages).
Notice of Allowance for U.S. Appl. No. 16/532,272, mailed Jun. 28, 2022. (12 pages).
Notice of Allowance for U.S. Appl. No. 18/092,403, mailed Jan. 24, 2024. (5 pages).
NVM Express over Fabrics specification, Revision 1.0a, available at https://nvmexpress.org/wp-content/uploads/NVMe-over-Fabrics-1_0a-2018.07.23-Ratified.pdf, Jul. 17, 2018 (51 pages).
Search Report for Chinese Application No. 201910727578X, mailed Jun. 28, 2024. (3 pages).
Search Report for Chinese Application No. 2019107311146, mailed Oct. 26, 2023. (3 pages).
Second Office Action for Chinese Application No. 2019107311146, mailed Jul. 12, 2024. (8 pages).
Summons to attend oral proceedings for Application No. 19 190 605.6, mailed Jul. 12, 2022 (7 pages).
U.S. Appl. No. 16/532,272, Non-Final Office Action, mailed Mar. 2, 2022 (27 pages).
U.S. Appl. No. 16/532,186, Non-Final Office Action, mailed Dec. 31, 2019 (13 pages).
Communication pursuant to Article 94(3) EPC in European Patent Application No. 19190677.5, dated Feb. 22, 2021 (4 pages).
Office Action for Korean Application No. 10-2019-0096066, mailed Nov. 11, 2024. (17 pages).
Office Action for Korean Application No. 10-2019-0096062, mailed Jan. 10, 2025. (13 pages).
Office Action in Korean Application No. 10-2019-0096065, mailed Aug. 6, 2025. (6 pages).
Extended Search Report for European Patent Application No. 23159250.2, mailed May 31, 2023. (5 pages).

* cited by examiner

NON-VOLATILE MEMORY SWITCH WITH HOST ISOLATION

CROSS REFERENCE TO RELATED APPLICATION

The present application is a continuation of U.S. application Ser. No. 18/101,495 (Now U.S. Pat. No. 12,099,398), filed on Jan. 25, 2023, entitled "NON-VOLATILE MEMORY SWITCH WITH HOST ISOLATION," which is a continuation of U.S. application Ser. No. 16/532,272 (Now U.S. Pat. No. 11,614,986), filed on Aug. 5, 2019, entitled "NON-VOLATILE MEMORY SWITCH WITH HOST ISOLATION," which claims the benefit of U.S. Provisional Application No. 62/715,713, filed Aug. 7, 2018, entitled, "NVMe Protocol Switch Host Isolation in Active-Active Configuration." All of the applications referenced above are incorporated by reference herein their entireties.

FIELD OF THE DISCLOSURE

The present disclosure generally relates to computer architecture, and more particularly to input/output devices and operations.

BACKGROUND

High performance computing environments increasingly use non-volatile memory (NVM), such as flash memory, for storage solutions. Instead of legacy storage interfaces optimized for rotating media technology, a host controller interface optimized for NVM is used. The NVM Express (NVMe) specification is a scalable host controller interface specification for NVM that leverages the Peripheral Component Interconnect-Express (PCIe®) architecture.

BRIEF DESCRIPTION OF THE DRAWINGS

Embodiments of the disclosure may be better understood by referencing the accompanying drawings.

DETAILED DESCRIPTION

The description that follows includes example systems, methods, techniques, and program flows that embody aspects of the disclosure. However, it is understood that this disclosure may be practiced without these specific details. For instance, this disclosure refers to PCIe in illustrative examples. Aspects of this disclosure can also be applied to another similar interconnect architecture or specification for highly scalable, high speed communications with non-volatile memory or solid state devices. In other instances, well-known instruction instances, protocols, structures and techniques have not been shown in detail in order not to obfuscate the description.

Overview

Dual-port NVM devices (e.g., solid state drives (SSDs)) allow for access to flash memory by multiple hosts at a cost. A NVM switch has been designed that allows multiple hosts to simultaneously and independently access a single port NVM device. While this active-active multi-host usage configuration allows for a variety of uses of lower cost single port NVM device (e.g., storage virtualization, redundant array of independent disks (RAID) features, etc.), an issue with one of the hosts (e.g., a failure, loss of reference clock, etc.) can delay or block transactions between the other host and the NVM device. The NVM switch includes logic that isolates activity of the multiple hosts despite logic of the switch being shared across the hosts. When the switch detects an issue with one host ("error host"), the switch clears the in-flight commands of the error host and flushes data of the error host. Likewise, the NVM switch ensures proper communication of error reporting from attached NVM devices to the multiple hosts.

Example Illustrations

Figure 1:
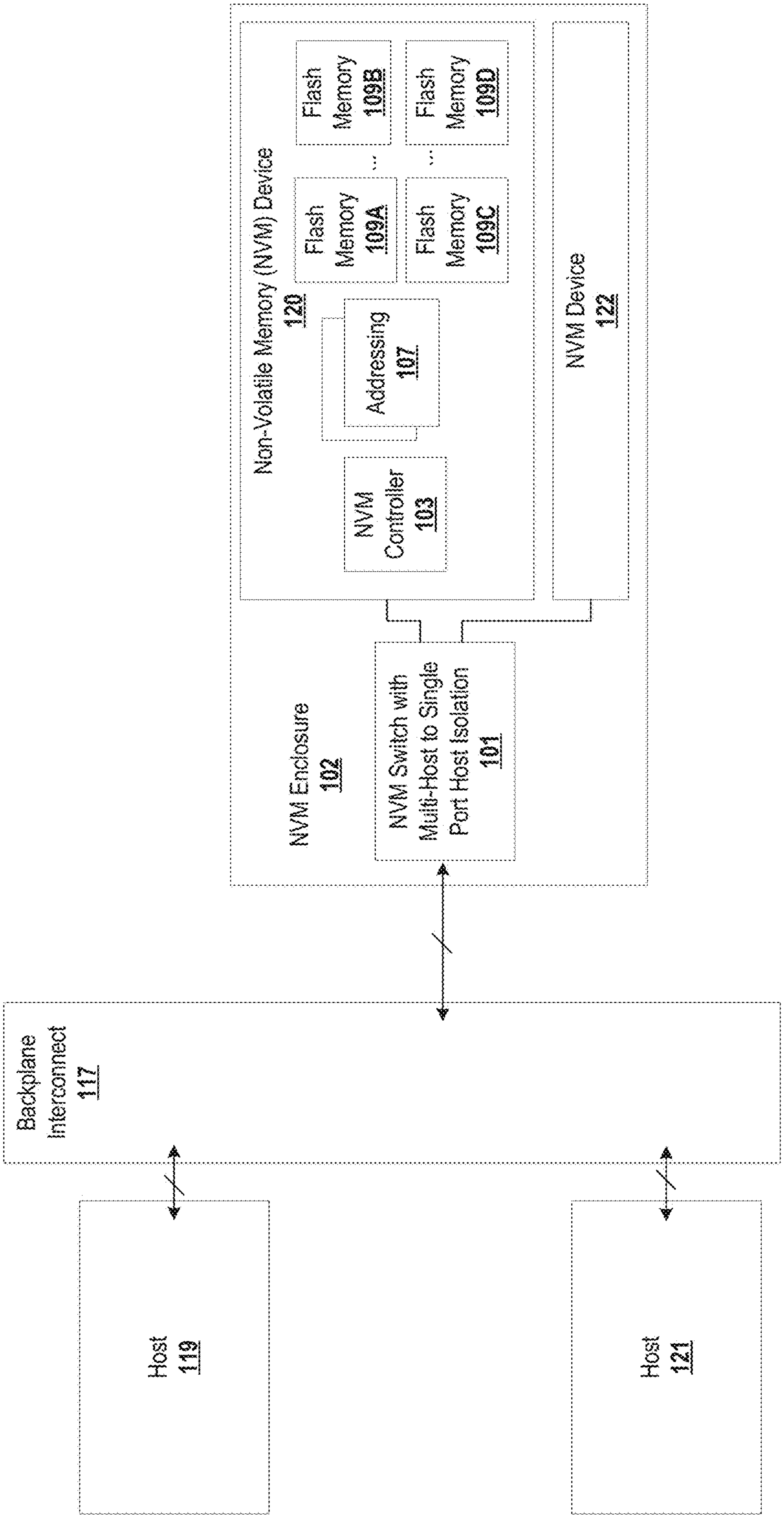
FIG. 1 depicts a block diagram of an example system that includes a NVM switch with logic and program code for multi-host to single port host isolation.

FIG. 1 depicts a block diagram of an example system that includes a NVM switch with logic and program code for multi-host to single port host isolation. The example system (e.g., a server rack) includes a backplane interconnect 117. Multiple hosts including a host 119 and a host 121 are connected to the backplane interconnect 117. An NVM enclosure 102 is also connected to the backplane interconnect. The hosts 119, 121 and the NVM enclosure 102 are each connected to the backplane interconnect 117 via a PCIe connector.

The NVM enclosure 102 comprises a NVM switch 101, a single port NVM device 120, and another single port NVM device 122. The NVM devices can have various configurations of solid state devices. In FIG. 1, the NVM device 120 is depicted with a NVM controller 103, addressing logic 107, and flash memory 109A-109D.

The NVM switch 101 facilitates the hosts 119, 121 concurrently and independently using the NVM devices 120, 122. The hosts 119, 121 maintain command queues and completion queues in their local memory. The hosts 119, 121 communicate, via the NVM switch, messages and requests (e.g., doorbell messages) to the NVM devices 120, 122. The NVM controller 103 retrieves commands via the NVM switch 101 from the command queues of the hosts 119, 121 responsive to messages from the hosts 119, 121. The NVM controller 103 writes completion packets via the NVM switch 101 to completion queues of the hosts 119, 121. Since each of the NVM devices 120, 122 is single port, the NVM switch 101 presents a single requestor to each of the NVM devices 120, 122. The NVM switch 101 comprises logic to route packets appropriately to the hosts 119, 121 and isolate errors among connected hosts.

Figure 2:
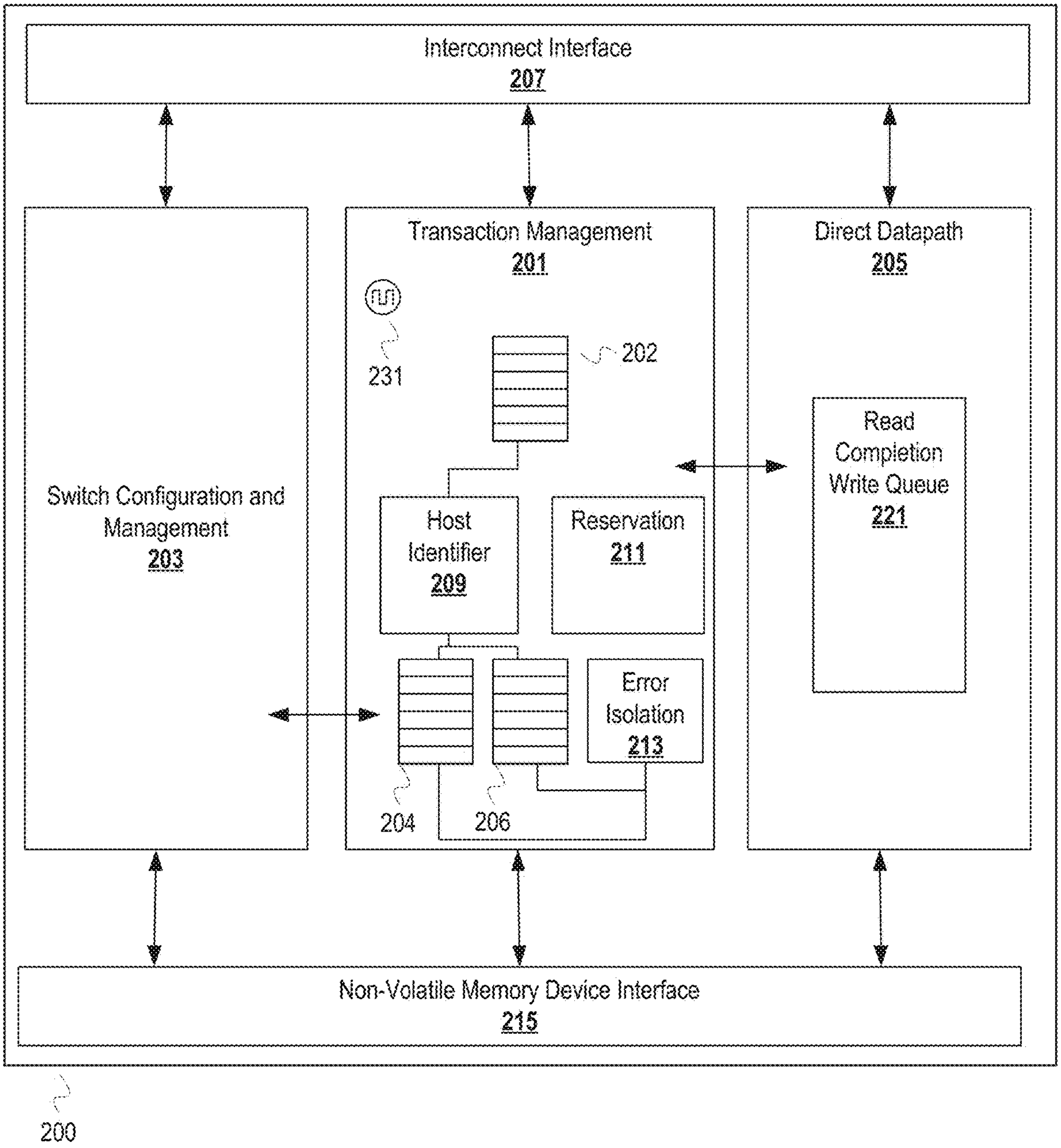
FIG. 2 is an example diagram of NVM switch logic to isolate hosts in an active-active configuration with single port NVM devices.

FIG. 2 is an example diagram of NVM switch logic to isolate hosts in an active-active configuration with single port NVM devices. A NVM switch 200 includes an interconnect interface 207 and a non-volatile memory device interface 215. These interfaces may be the same but may be different. For example, the interface 207 may be a PCIe interface with a greater number of lanes than the interface 215. This example illustration presumes that hosts (root complexes from the perspective of the switch 200) are linked via the interconnect interface 207 and a NVM memory device attaches to the switch 200 by the interface 215. The switch 200 includes switch configuration and management logic 203, transaction management logic 201, and direct datapath logic 205. The term "logic" refers to an arrangement of circuitry to achieve a task or function. For instance, logic that determines whether values match may be a circuit arrangement that uses exclusive NOR gates and an AND gate for equality comparison. The configuration and management logic 203 directs administrative and configuration commands to attached NVM devices. The direct datapath logic 205 allows writes for read completions to traverse the switch 200 with little to no delay. The transaction management logic 201 prevents hosts from affecting each other. This at least includes isolating performance affecting events to transactions of the host for which the events occurred ("error host"), propagating error reporting according to host specific error reporting settings, and monitoring for errors in the direct datapath logic 205.

The transaction management logic 201 includes registers and logic to facilitate functionality for preventing an event from one host affecting transactions of another host. The transaction management logic includes queue 202, a timing source 231, host identifier logic 209, reservation logic 211, error isolation logic 213, queue 204, and queue 206. The queues 202, 204, 206 may be 32 bit registers, 64 bit registers, or a different type of memory element appropriate for the physical space available for the switch 200. The queue 202 stores incoming packets from hosts. Examples of the incoming packets include doorbell messages, commands fetched from host memory, and completion responses. Since the switch 200 accommodates multiple hosts, the reservation logic 211 reserves different regions of attached memory or backend devices to the hosts to prevent the hosts from overwriting each other. When the hosts establish connections with the backend devices via the switch 200, the reservation logic 211 creates and maintains mappings of reserved memory space to each of the hosts. The reservation logic 211 may leverage available private namespace functionality to implement the reservations. Another responsibility of the switch 200 is to present a single host to the backend devices since the backend devices are single port. This conceals from the backend devices that multiple hosts on the other end of the switch 200. The host identifier logic 209 and the queues 204, 206 operate to ensure coherency of communications between the backend devices and the hosts despite the backend devices being presented a single host. The host identifier logic 209 associates a first host identifier with queue 204 and a second host identifier with queue 206. Implementations may add additional queues depending on the number of hosts connected to the backend devices through a NVM switch. The host identifier logic 209 copies subfield values from a header of an incoming read type packet into the one of the queues 204, 206 corresponding to the detected host identifier (e.g., requestor identifier or node identifier). These copied values will be used to determine which of the hosts is the correct requestor. With reserved spaces, the host identifier logic 209 may copy the length, address, and ordering tag fields to match a later read completion packet that writes data returned responsive to the read type packet. The host identifier logic 209 then resets the host identifier in the incoming packet to conform to the expected host identifier (e.g., root complex 0) of the backend devices before allowing the incoming packet to flow to the backend device.

When a backend device returns a read completion packet, the backend device writes the completion packet through the switch to the requestor. The read completion packet will have a host identifier as reset by the switch 200. When a backend device writes a completion packet into a completion write queue 221 of the direct datapath logic 205, the host identifier 209 determines which of the queues 204, 206 has an entry matching at least the stored fields (e.g., length, ordering tag, address).

With the preservation of host/requestor at the switch, the error isolation logic 213 can prevent host events from affecting each other. The error isolation logic 213 can cause appropriate packets to be cleared from the queue 202 based on detecting a problem event with one of the hosts. The error isolation logic 213 can also clear completion packets from the direct data path logic 205 that correspond to a failed or disconnected host. In addition, the error isolation logic 213 can transition the NVM switch 200 to using the internal timing source 231 in response to detection of a loss of clock reference for one of the adapters. The switch 200 transitions to the timing source 231 for processing and communication of packets from the adapter for which the reference clock was lost.

While FIG. 2 depicts discrete logic blocks, the distinct blocks are not necessarily physical boundaries of microchips. For instance, an NVM switch may comprise a processor that is logically part of multiple of the depicted logic blocks.

The flowcharts in FIGS. 3-8 depict example operations related to handling error conditions to preserve host isolation. The description refers to the switch as performing the example operations. The switch performs at least some of the operations according to program instructions (e.g., firmware) stored on an NVM switch.

Figure 3:
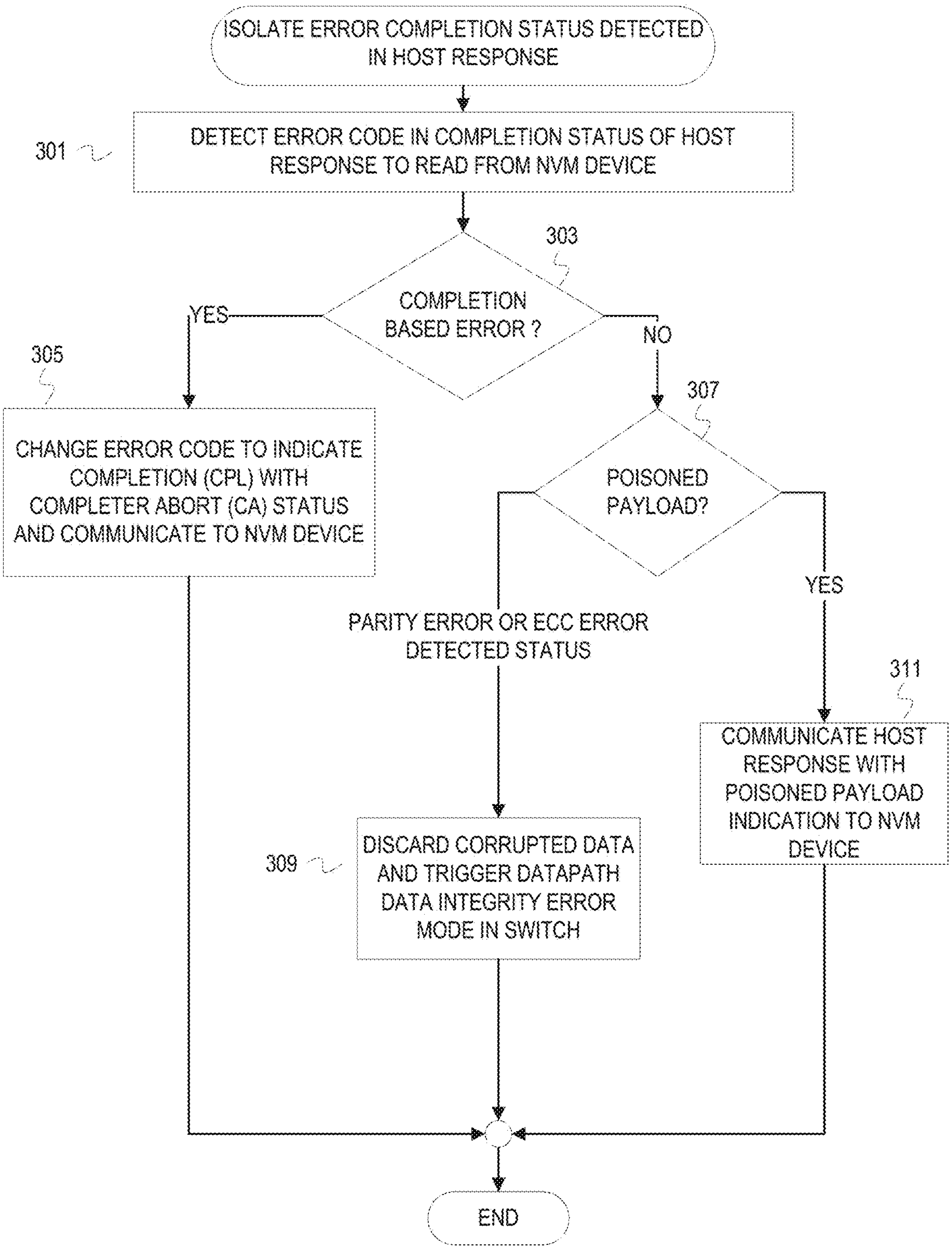
FIG. 3 is a flowchart of example operations for isolating an error completion status detected in a host response.

FIG. 3 is a flowchart of example operations for isolating an error completion status detected in a host response. After a backend device requests to read data from host memory, the host provides a packet with read completion data to the backend device. This packet includes a field for a completion status that may indicate an error. The NVM switch reads the packet before communicating the completion data to the backend device.

At block 301, the switch detects an error code in the completion status of the host response to a read from a backend device. The error code may indicate a completion based error, a poisoned payload notification, and an internal parity error or error-correcting code error. The switch may compare the bits at the location corresponding to the completion status against predefined error codes or lookup the completion status value in a completion status table.

At block 303, the switch determines whether the completion status indicates a completion based error. Examples of a completion based error may be completer abort (CA) unsupported request (UR), and a completion timeout.

If the error code in the completion status field is completion based, then the switch modifies the completion status in the host response at block 305. The switch changes the error code in the completion status to indicate completion with completer abort (CA) before allowing the host response to be transmitted to the backend device identified in the host response.

At block 307, the switch determines whether the completion status field indicates a poisoned payload. If the completion status field indicates a poisoned payload, then control flows to block 311. At block 311, the switch communicates the host response with the poisoned payload indication to the backend device. Otherwise, control flows to block 309.

If the completion status indicates an internal parity error or ECC error detected at the host, then at block 309, the switch discards the corrupted data and triggers a datapath data integrity error mode in the switch. In this mode, all requests from the backend device to the particular host will be dropped and read requests will be completed with an error. For example, the switch may set a value in a register associated with the port of the backend device. When the switch receives a request from backend devices, the switch determines the corresponding host identifier. If the host identifier matches the value associated with the port of the backend device with the determined host, then the request will be discarded.

Figure 4:
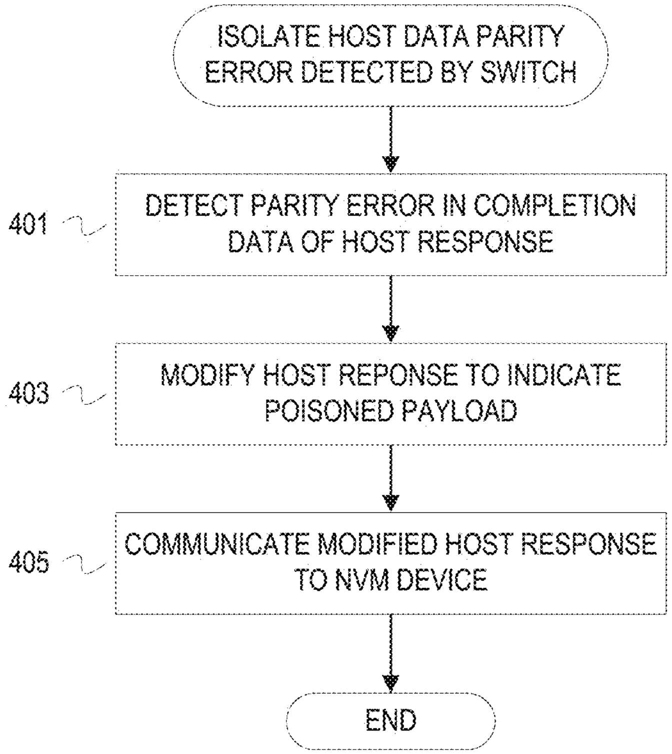
FIG. 4 is a flowchart of example operations for a NVM switch to isolate a host data error detected by the switch.

FIG. 4 is a flowchart of example operations for a NVM switch to isolate a host data error detected by the switch. While trying to avoid inserting delay into the path of NVM transactions, the switch also supports data integrity. If the data integrity error mode is activated, then the switch evaluates data parity of read packets and read completion packets traversing the switch.

At block 401, a switch detects data parity error in completion data of a host response. This detection may be detecting the bits set by data link layer components.

At block 403, the switch modifies the read packet host response to indicate poisoned payload in the completion status field. The switch may use a stored poisoned payload code to propagate this parity error detection.

At block 405, the switch communicates the modified host response to a backend device.

Figure 5:
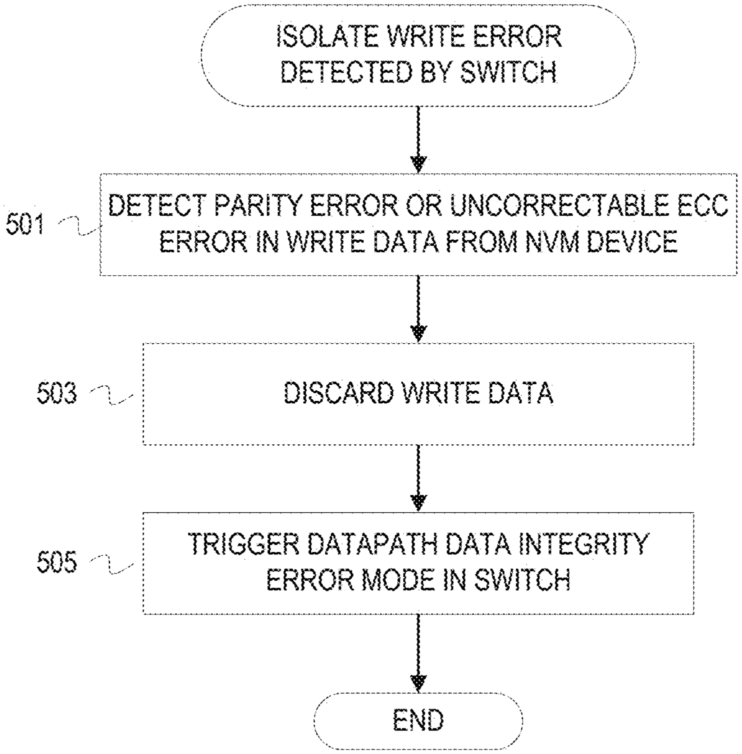
FIG. 5 is a flowchart of example operations for a NVM switch to isolate data errors detected in read completion packets.

FIG. 5 is a flowchart of example operations for a NVM switch to isolate data errors detected in write transactions. The direct datapath logic of the NVM switch may be set to check for parity or ECC errors in data of write transactions from backend devices.

At block 501, the switch detects a parity error or uncorrectable ECC error in write data from a backend device. The switch may inspect the data link layer bits to detect internal parity errors or uncorrectable ECC errors.

At block 503, the switch discards the write data. Discarding of the write data is discarding of the entire write transaction issued by the backend device.

At block 505, the switch triggers the datapath data integrity error mode. In this mode, all requests from the backend device to the particular host will be dropped and read requests will be completed with an error.

Figure 6:
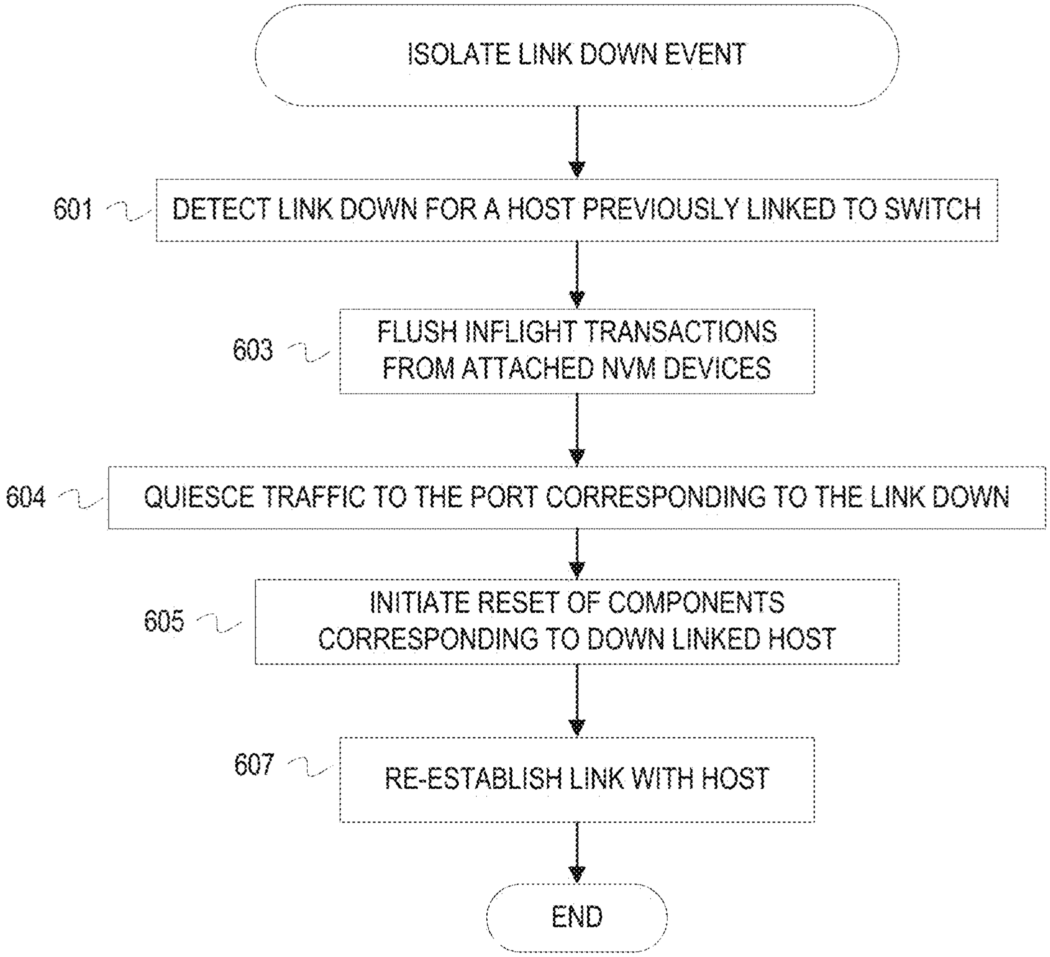
FIG. 6 is a flowchart of example operations for a NVM switch to isolate a link down event from one of multiple hosts.

FIG. 6 is a flowchart of example operations for a NVM switch to isolate a link down event from one of multiple hosts. At block 601, the switch detects a link down for a host that was previously linked to the switch. The data link layer components or components of a PCIe core detect a link down. The link down indication includes an identifier of the corresponding host. At block 603, the switch triggers a transaction flush of all inflight transactions from the NVM devices attached to the switch targeting the linked down host. At block 604, the switch quiesces traffic to the link down port. To quiesce the traffic to the link down port, the switch issues aborts to all outstanding commands associated with the host that are pending in the NVM devices. At block 605, the switch initiates reset of the components corresponding to the down linked host. At block 607, the switch re-establishes or attempts to re-establish the link with the host.

Figure 7:
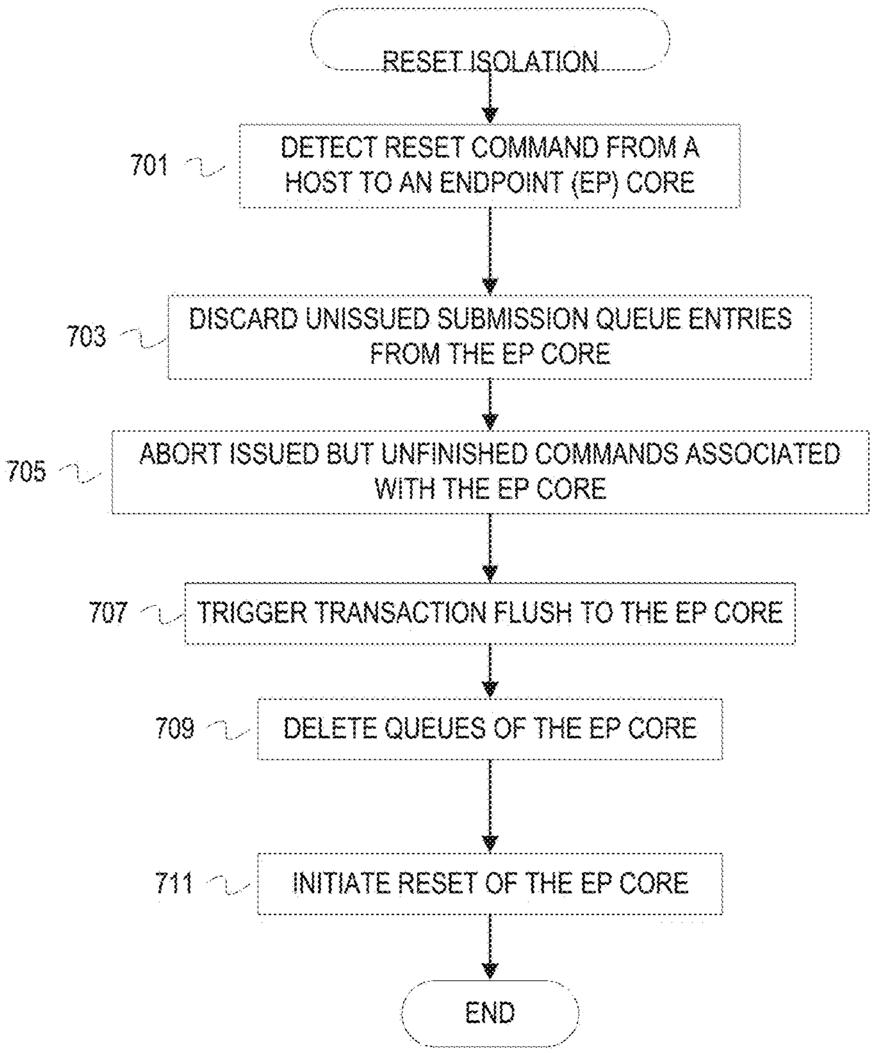
FIG. 7 is a flowchart of example operations for a NVM switch to isolate a reset from one of multiple connected hosts.

FIG. 7 is a flowchart of example operations for a NVM switch to isolate a reset from one of multiple connected hosts. The switch treats reset events per link. A reset event may be a warm reset (PERST), hot reset, disable link, and function level reset (FLR). At block 701, the switch detects a reset command from a host to an endpoint (EP) core that implements the lower layer protocols (e.g., data link layer, physical layer). The switch detects the reset because the reset signal or command generates an interrupt to the switch. At block 703, the switch discards unissued submission queue entries received via the EP core. At block 705, the switch aborts issued but unfinished commands associated with the EP core. The switch determines in-flight read commands that lack a corresponding read completion in the write queue destined for the host. The switch then sends an abort command for each of these incomplete transactions to a respective backend device. At block 707, the switch triggers a transaction flush to the EP core. The switch asserts signals to cause the EP core to clear packets traversing the EP core. At block 709, the switch deletes queues associated with the EP core being reset. At block 711, the switch initiates reset of the EP core.

Figure 8:
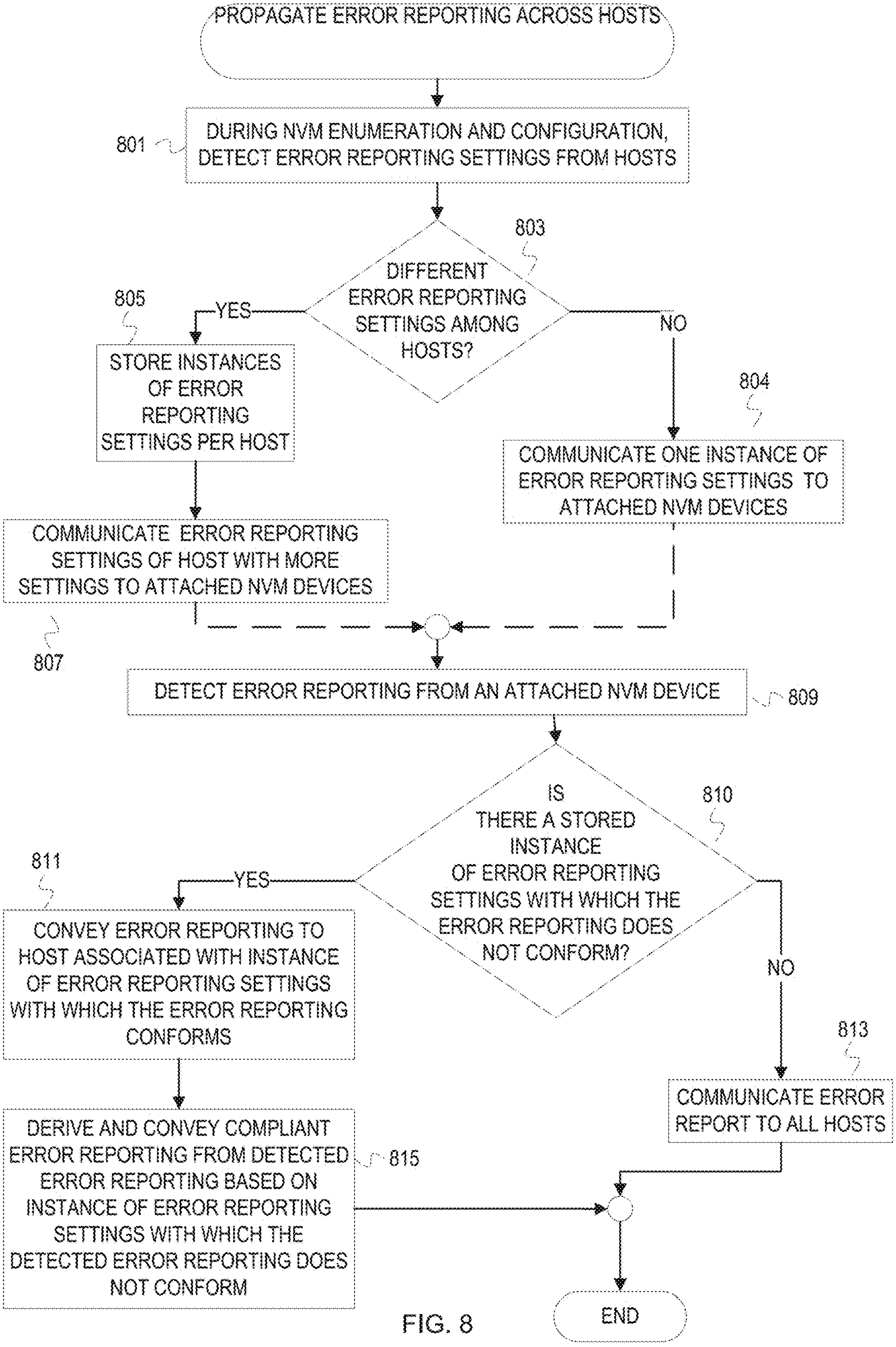
FIG. 8 is a flowchart of example operations for a NVM switch to propagate error reporting across hosts.

FIG. 8 is a flowchart of example operations for a NVM switch to propagate error reporting across hosts. Error reporting settings include basic error reporting and advanced error reporting (AER) settings that are set in registers of backend devices. At block 801, the switch detects error reporting settings from hosts during enumeration and configuration operations. At block 803, the switch determines whether the error reporting settings differ across hosts. If the error reporting settings are the same across hosts, then the switch communicates one instance of the error reporting settings to the attached backend devices at block 804. If the error reporting settings differ, then the switch stores the instances of the error reporting settings per host at block 805. The switch associates a corresponding host identifier to each instance of error reporting settings. This will be used to ensure host specific compliance by the error reporting from backend devices. At block 807, the switch communicates the instance of host provided error reporting settings with more settings to the attached backend devices.

At some point later, the switch may detect an error report from a backend device at block 809. At block 810, the switch determines whether there is a stored instance of error reporting settings with which the error reporting does not conform. For example, a stored instance of error reporting settings may indicate that error reporting should be by completion status while the detected error reporting is by error message. At block 813, the switch communicates the error report to all hosts because the error reporting conforms to the instances of error reporting settings. If non-conformance is detected for one instance of error reporting settings, then the switch conveys the error reporting to the host associated with the instance of error reporting settings with which the error reporting conforms at block 811. At block 815, the switch derives and conveys error reporting for the other instance of error reporting settings. The switch extracts information from the detected error reporting and generates error reporting with that information in compliance with the instance of error reporting settings.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electro-magnetic, optical, or any suitable combination thereof. A machine readable signal medium may be any machine readable medium that is not a machine readable storage medium and that can communicate, propagate, or transport a program for use by or in connection with an instruction execution system, apparatus, or device.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Terminology

As used herein, the term "or" is inclusive unless otherwise explicitly noted. Thus, the phrase "at least one of A, B, or C" is satisfied by any element from the set {A, B, C} or any combination thereof, including multiples of any element.

What is claimed is:

1. A method implemented by a non-volatile memory (NVM) switch that is configured to communicate with a plurality of host devices and a plurality of solid state drives (SSDs), the method comprising:

detecting, at the NVM switch, that a communication link between the NVM switch and a first host device, amongst the plurality of host devices, has gone down; and in response to detecting that the communication link between the NVM switch and the first host device has gone down, flushing, by the NVM switch, inflight memory access messages between the first host device and the plurality of SSDs while continuing to transfer memory access messages between i) one or more other host devices, amongst the plurality of host devices, and ii) the plurality of SSDs.

2. The method of claim 1, further comprising:

further in response to detecting that the communication link between the NVM switch and the first host device has gone down, resetting, by the NVM switch, one or more components of the NVM switch that correspond to the communication link between the NVM switch and the first host device while continuing to transfer memory access messages between i) the one or more other host devices and ii) the plurality of SSDs.

3. The method of claim 1, further comprising:

further in response to detecting that the communication link between the NVM switch and the first host device has gone down, attempting to reestablish, by the NVM switch, the communication link between the NVM switch and the first host device while continuing to transfer memory access messages between i) the one or more other host devices and ii) the plurality of SSDs.

4. The method of claim 1, further comprising:

further in response to detecting that the communication link between the NVM switch and the first host device has gone down, prompting, by the NVM switch, one or more SSDs, amongst the plurality of SSDs, to stop sending, to the NVM switch, data intended for the first host device while continuing to transfer memory access messages between i) the one or more other host devices and ii) the plurality of SSDs.

5. The method of claim 4, wherein prompting the one or more SSDs to stop sending data intended for the first host device comprises:

issuing, by the NVM switch, aborts to the one or more SSDs, the aborts corresponding to outstanding commands associated with the first host device.

6. The method of claim 1, wherein detecting that the communication link between the NVM switch and the first host device has gone down comprises:

detecting, by Peripheral Component Interconnect Express (PCIe) circuitry of the NVM switch, that a PCIe communication link between the NVM switch and the first host device has gone down.

7. A non-volatile memory (NVM) switch that facilitates access by a plurality of host devices to a plurality of solid state drives (SSDs), the NVM switch comprising:

a first communication interface configured to transfer memory access messages between the NVM switch and the plurality of host devices;

a second communication interface configured to transfer memory access messages between the NVM switch and the plurality of SSDs; and control circuitry configured to:

determine that a communication link between the NVM switch and a first host device, amongst the plurality of host devices, has gone down, and in response to determining that the communication link between the NVM switch and the first host device has gone down, flush inflight memory access messages between the first host device and the plurality of SSDs while the NVM switch continues to transfer memory access messages between i) one or more other host devices, amongst the plurality of host devices, and ii) the plurality of SSDs.

8. The NVM switch of claim 7, wherein:

the first communication interface comprises one or more components that correspond to the communication link between the NVM switch and the first host device; and the control circuitry is further configured to, further in response to determining that the communication link between the NVM switch and the first host device has gone down, reset the one or more components while the NVM switch continues to transfer memory access messages between i) the one or more other host devices and ii) the plurality of SSDs.

9. The NVM switch of claim 7, wherein the control circuitry is further configured to:

further in response to determining that the communication link between the NVM switch and the first host device has gone down, control the first communication interface to attempt to reestablish the communication link between the NVM switch and the first host device while the NVM switch continues to transfer memory access messages between i) the one or more other host devices and ii) the plurality of SSDs.

10. The NVM switch of claim 7, wherein the control circuitry is further configured to:

further in response to determining that the communication link between the NVM switch and the first host device has gone down, prompt one or more SSDs, amongst the plurality of SSDs, to stop sending, to the NVM switch, data intended for the first host device while the NVM switch continues to transfer memory access messages between i) the one or more other host devices and ii) the plurality of SSDs.

11. The NVM switch of claim 10, wherein the control circuitry is further configured to prompt one or more SSDs to stop sending data intended for the first host device by at least:

issuing aborts to the one or more SSDs, the aborts corresponding to outstanding commands associated with the first host device.

12. The NVM switch of claim 7, wherein:

the first communication interface includes Peripheral Component Interconnect Express (PCIe) circuitry configured to inform the control circuitry when a PCIe communication link between the NVM switch and the first host device has gone down.

13. The NVM switch of claim 7, wherein the control circuitry comprises:

a processor; and a memory coupled to the processor, the memory storing machine-readable instructions that, when executed by the processor, cause the processor to:

determine that the communication link between the NVM switch and the first host device has gone down, and in response to determining that the communication link between the NVM switch and the first host device has gone down, flush inflight memory access messages between the first host device and the plurality of SSDs while the NVM switch continues to transfer memory access messages between i) one or more other host devices, amongst the plurality of host devices, and ii) the plurality of SSDs.

14. The NVM switch of claim 7, wherein the NVM switch is included in a system further comprising: the plurality of SSDs communicatively coupled to the second communication interface.

15. The NVM switch of claim 14, further comprising: the system including a Peripheral Component Interconnect Express (PCIe) interconnect that communicatively couples the plurality of SSDs and the second communication interface.

16. The NVM switch of claim 14, further comprising: the system including the plurality of host devices communicatively coupled to the first communication interface.

17. The NVM switch of claim 16, further comprising: the system including a Peripheral Component Interconnect Express (PCIe) interconnect that communicatively couples the plurality of host devices and the first communication interface.

18. A non-transitory, computer-readable memory storing machine-readable instructions that, when executed by a processor of a non-volatile memory (NVM) switch, cause the processor to:

determine that a communication link between the NVM switch and a first host device, amongst a plurality of host devices communicatively coupled to the NVM switch, has gone down; and in response to determining that the communication link between the NVM switch and the first host device has gone down, control the NVM switch to flush inflight memory access messages between the first host device and a plurality of SSDs while the NVM switch continues to transfer memory access messages between i) one or more other host devices, amongst the plurality of host devices, and ii) the plurality of SSDs.

19. The non-transitory, computer-readable memory of claim 18, further storing machine-readable instructions that, when executed by the processor, cause the processor to:

further in response to detecting that the communication link between the NVM switch and the first host device has gone down, control the NVM switch to reset one or more components of the NVM switch that correspond to the communication link between the NVM switch and the first host device while continuing to transfer memory access messages between i) the one or more other host devices and ii) the plurality of SSDs.

20. The non-transitory, computer-readable memory of claim 18, further storing machine-readable instructions that, when executed by the processor, cause the processor to:

further in response to detecting that the communication link between the NVM switch and the first host device has gone down, control the NVM switch to attempt to reestablish the communication link between the NVM switch and the first host device while continuing to transfer memory access messages between i) the one or more other host devices and ii) the plurality of SSDs.

21. The non-transitory, computer-readable memory of claim 18, further storing machine-readable instructions that, when executed by the processor, cause the processor to:

further in response to detecting that the communication link between the NVM switch and the first host device has gone down, prompt one or more SSDs, amongst the plurality of SSDs, to stop sending, to the NVM switch, data intended for the first host device while continuing to transfer memory access messages between i) the one or more other host devices and ii) the plurality of SSDs.

22. The non-transitory, computer-readable memory of claim 21, further storing machine-readable instructions that, when executed by the processor, cause the processor to:

prompt the one or more SSDs to stop sending data intended for the first host device by at least sending aborts to the one or more SSDs, the aborts corresponding to outstanding commands associated with the first host device.

* * * * *